Figure 6:
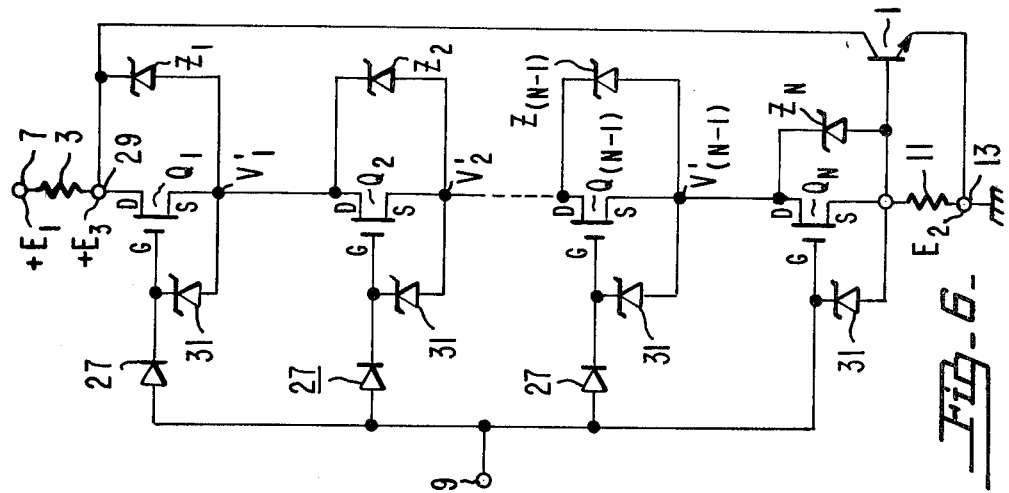

United States Patent [19]

Baker

[11] 4,367,421
[45] Jan. 4, 1983

[54] BIASING METHODS AND CIRCUITS FOR SERIES CONNECTED TRANSISTOR SWITCHES

[75] Inventor: Richard H. Baker, Bedford, Mass.

[73] Assignee: Reliance Electric Company, Cleveland, Ohio

[21] Appl. No.: 142,168

[22] Filed: Apr. 21, 1980

[51] Int. Cl.³ .............................. H03K 17/60
[52] U.S. Cl. .................... 307/570; 307/254; 307/571
[58] Field of Search ............ 307/570, 571, 254

[56] References Cited

U.S. PATENT DOCUMENTS

| | | | |
|---|---|---|---|
| 2,907,889 | 10/1959 | Kaybell et al. | 307/254 |
| 3,227,889 | 1/1966 | Paynter | 307/254 |
| 3,268,776 | 8/1966 | Reed | 307/254 |
| 3,496,385 | 2/1970 | Hopkins | 307/254 |
| 3,585,403 | 6/1971 | Gribbons | 307/254 |

Primary Examiner—Harold A. Dixon
Attorney, Agent, or Firm—Allan M. Lowe; Kenneth Watov

[57] ABSTRACT

In one embodiment of the invention, a switching circuit is provided by connecting the main current paths of a plurality of relatively low voltage transistors in series for switching a relatively high level of voltage, with zener diodes being connected across the main current paths of each one of the transistors, the zeners having a breakdown voltage rating no greater than the inverse voltage rating of their respective transistor, and polarized for breaking down whenever the inverse voltage rating of the transistor is exceeded, the zener diodes also providing a voltage divider circuit for applying appropriate levels of bias voltage to the common connections between the transistors for ensuring the inverse voltage ratings of the transistors are not exceeded at times that the transistors are all turned off, or non-conductive.

37 Claims, 8 Drawing Figures

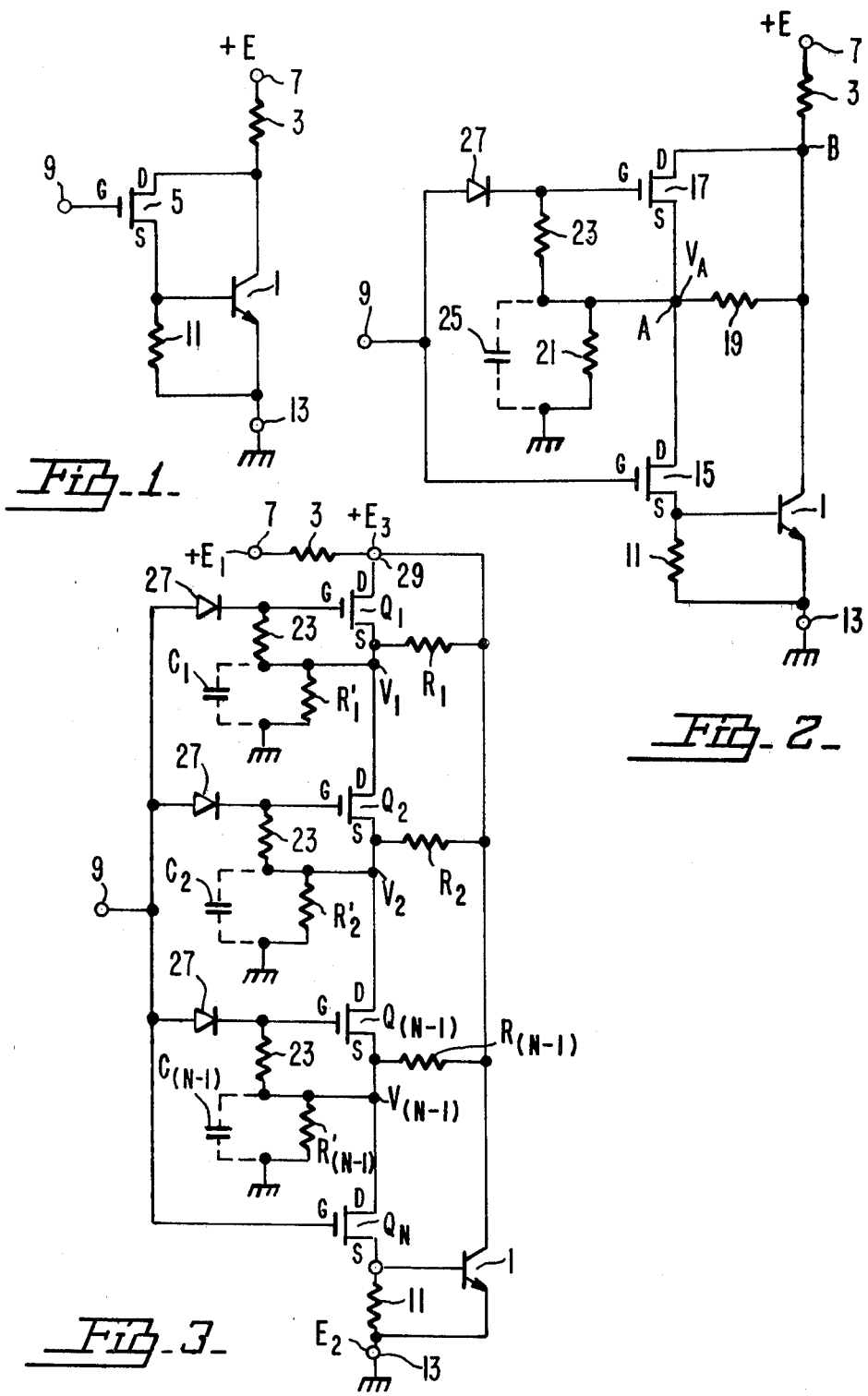

BIASING METHODS AND CIRCUITS FOR SERIES CONNECTED TRANSISTOR SWITCHES

The field of the present invention relates generally to switching circuits, and more specifically to a method and circuit wherein a plurality of relatively low voltage transistors are connected to switch an operating voltage having a substantially higher level than the voltage rating of each one of the individual switching transistors.

In one embodiment of the present invention, a plurality of N (where N is an integer greater than one) switching transistors are protected from excessive inverse voltage across paths having main current paths connected in series between opposite terminals of a voltage source by (1) dividing the voltage between the terminals into a plurality of (N−1), each bias voltage having a predetermined level; (2) applying the (N−1) bias voltages to the common connections between the main current paths of the N switching transistors, respectively, for maintaining the voltage across each main current path at a level no greater than the path inverse voltage rating, when said N switching transistors are non-conductive or turned off; and (3) limiting the level of voltage across the main current paths of the N switching transistors to the inverse voltage ratings, respectively, regardless of the conduction states of the N transistors.

In the drawing, wherein like items are identified by the same reference numerals, wherein:

FIG. 1 is a schematic diagram of my prior invention wherein a metallic oxide semiconductor field effect (MOSFET) transistor supplies base current to a bipolar transistor and has a main current path in a negative feedback path between the collector and base electrodes of the bipolar transistor to improve the transient response and capability and turn-off time of the bipolar transistor; and FIGS. 2 through 8 are circuit schematic diagrams of different embodiments of my present invention, respectively.

In FIG. 1, an NPN bipolar transistor 1 includes a collector electrode connected to one terminal of a load 3 and a drain (D) electrode of a field effect transistor 5. The other terminal of the load 3 is connected to a power terminal 7 for receiving an operating voltage +E. Also, the field effect transistor (hereinafter referred to as an FET) 5 includes a source (S) electrode connected to the base electrode of the bipolar transistor 1, and a gate (G) electrode connected to an input terminal 9 for receiving a control signal. A low value resistor 11 is connected between the base and emitter electrodes of the bipolar transistor 1, to ensure rapid turn off of transistor 1 from a conductive state in response to zero bias at the bipolar base electrode. The emitter of transistor 1 is connected to terminal 13 for receiving a source of reference potential, in this example, ground. The switching circuit is operated by applying a positive going control signal, typically +15 volts to input terminal 9 for turning on transistor 5, causing the impedance of the main current path of transistor 5 between the source and drain thereof, to be substantially reduced, permitting current to flow from terminal 7, through resistor 3 and the main current path of transistor 5, into the base electrode of transistor 1, causing transistor 1 to turn on rapidly. Some of the current flowing through transistor 5 also flows through resistor 11 to ground. Once turned on, transistor 1 is substantially prevented from going into a saturated conduction state because of the negative feedback path provided by the main current path of transistor 5 between the collector and base electrodes of transistor 1. Also, this negative feedback path improves the transient capability of transistor 1, by increasing the magnitude of the base current thereto whenever a transient increase in the magnitude of current flowing into the collector electrode of transistor 1 causes the voltage across the collector and emitter electrodes ($V_{CE}$) to increase. In this manner, transistor 1 is substantially operated near the edge of saturation but not in saturation, assuming that the impedance of the load 3 is such that transistor 1 could be operated in a saturated state where it not for negative feedback provided. The operation of this switching circuit is described in greater detail in my copending application, Ser. No. 41,008, filed on May 21, 1979, for VMOS/BIPOLAR POWER SWITCH.

In FIG. 1, transistor 5 is shown as a MOSFET transistor. One advantage of using a MOSFET transistor is that such transistors have high input impedance, which provides a very high gain for the circuit of FIG. 1. However, in relatively high power switching applications, where the level of +E is necessarily a relatively high voltage, transistor 5 must be a power MOSFET transistor, such as a VMOS or DMOS, for example, which has the disadvantage of presently being expensive, and typically has a relatively high "on resistance" with present technology, causing undesirable power dissipation when conducting.

As shown in FIG. 2, the present inventor discovered that he could improve upon his switching circuit of FIG. 1, by connecting the main source drain current paths of two field effect transistors 15,17, respectively, in series, and connecting them as shown for providing the function of transistor 5 of FIG. 1, and at the same time providing appropriate biasing as described infra, for permitting these transistors 15,17 to have typically half the inverse voltage rating of transistor 5 of FIG. 1. For example, when the switching circuit of FIG. 1 is turned off, by removing the control signal from input terminal 9, typically by reducing the magnitude of the control signal to ground, in this example, +E volts is applied across the main current path (between the drain and source electrodes thereof) of transistor 5. Accordingly, transistor 5 must have a voltage rating of at least +E volts. In the first embodiment of the invention, as illustrated in FIG. 2, a resistive voltage divider including resistors 19 and 21 provides a bias voltage $V_A$ at the common connection of the main current paths of transistors 15 and 17. When transistors 15 and 17 are turned off, the voltage ratings of transistors 15 and 17 need only be equal to $V_A$ and $(E-V_A)$, respectively. In the preferred embodiment, resistors 19 and 21 are of equal value, and have substantially higher resistance than load 3, so the value of $V_A$ is about equal to $\frac{1}{2}E$. In this latter example, the voltage ratings of transistors 15 and 17 are identical and equal to at least $\frac{1}{2}E$ volts, reducing the need for different transistor types. Resistor 23 to prevents the voltage between the gate G and source S electrodes of transistor 17 from floating with respect to the reference potential at terminal 13. Capacitor 25, as shown in phantom, represents the capacitance due to parasitic and lead capacitance at point A; however, in certain applications capacitor 25 is provided externally, as described infra. Blocking diode 27 prevents current flow from the output point of the voltage divider 19,21 to input terminal 9.

Operation of the circuit of FIG. 2 is now described. A positive going control signal is applied to input terminal 9, causing transistor 15 to turn on, substantially reducing the impedance of the main current path of transistor 15, thereby permitting base current to flow into the base electrode of bipolar transistor 1. In response to the flow of base current, transistor 1 turns on so there is a substantial reduction of the impedance of its main current path, causing a substantial drop in the voltage at point B. This drop in voltage at point B is rapid enough to prevent excessive inverse voltage from being applied across transistor 17 after turn-on of transistor 15. As the level of the voltage at point B drops, the voltage $V_A$ at point A drops correspondingly, causing diode 27 to become forward biased when the voltage $V_A$ drops to at least one diode drop below the level of the control voltage at input terminal 9. Typically, assuming that the level of the control voltage is +15 volts, diode 27 becomes forward biased when the voltage $V_A$ drops to about 14.4 volts, and when the voltage $V_A$ drops an additional 5 or 6 volts, that is, to about 8 volts, the voltage across the gate and source electrodes of transistor 17 is about +8 volts with respect to the gate, causing transistor 17 to turn on, completing the turn-on cycle for the circuit of FIG. 2. The timing of the turn-on of the circuit of FIG. 2 is partly dependent upon the value of the capacitor 25. When this circuit is turned off, capacitor 25 charges to a voltage level of thereacross of $V_A$ volts, via the charge current conduction path provided by load 3 and resistor 19. When transistor 15 initially turns on, capacitor 25 discharges through the discharge current path provided by the on-resistance of transistor 15 in series with the parallel combination of resistor 11 and the input impedance of transistor 1. Accordingly, the rate of discharge of capacitor 25 is determined by a time constant equal to the product of the value of capacitor 25 times the value of the resistance provided by the on-resistance of transistor 15 in series with the parallel combination of resistor 11 and the input impedance of transistor 1. Since the value of capacitor 25 is typically very small, the capacitor discharges very quickly. In certain applications, it may be desirable to include additional capacitance by providing a discrete capacitor for capacitor 25 the capacitance of the discrete capacitor is additive to the parasitic capacitances to obtain a desired turn-on time for the circuit of FIG. 2. When the control signal applied to terminal 9 is removed or its level is reduced, for example, to ground transistor 15 responds by turning off so there is a substantial increasing of the impedance of its main current path, interrupting the flow of base current to transistor 1, causing the latter to turn off and the voltage at point B to approach +E volts, and the bias voltage $V_A$ to correspondingly increase to its predetermined value for the off condition of the circuit of FIG. 2. As transistor 1 so turns off, diode 27 again becomes backbiased, and capacitor 25 charges to follow the rise in voltage of $V_A$; the charging time constant being equal to the product of the value of capacitor 25 times the sum of the resistive values of resistor 19 and load impedance 3. Also, turn off of transistor 15 interrupts the flow of current through transistor 17, which is substantially turned off at the same time as transistor 15. Because transistors 15 and 17 have a much faster turn-off time than transistor 1 and capacitor 25 has a very small value, the voltage at point A very quickly rises in correspondence with the increase in voltage at point B as transistor 1 turns off, ensuring that the inverse voltage ratings of transistors 15 and 17 are not exceeded.

As described above, in FIG. 2, transistors 15 and 17 provide the function of transistor 5 of FIG. 1. The circuit of FIG. 2 has an advantage over that of FIG. 1 because it employs lower inverse voltage rated transistors 15,17 having an on-resistance substantially lower than that of transistor 5, assuming similar conditions of operating voltage and load impedance. Also, the lower inverse voltage rated transistors 15, 17, tend to be less expensive than the higher voltage transistor 5 required in the circuit of FIG. 1. Alternatively, assuming that transistors 5, 15, and 17 are identical types, the circuit of FIG. 2 can be used to switch as operating voltage +E having a value twice the level of the operating voltage in the circuit of FIG. 1. In other words, the circuit of FIG. 2 is capable of switching higher voltages than the circuit of FIG. 1, assuming that the control transistor is identical in type to the control transistors 15 and 17. Transistors 15 and 17 are not necessarily MOSFET transistors, but can be bipolar transistors so long as the bipolar transistors have substantially faster switching times than output transistor 1. However, the use of bipolar transistors for the control transistors 15,17 in place of power MOSFETS would substantially reduce the input impedance of this switching circuit, and correspondingly the power gain of the circuit.

In FIG. 3, a second embodiment of the invention, the first embodiment of the invention of FIG. 2 is expanded to include plural N control or switching transistors $Q_1$ through $Q_N$ to provide the function of transistor 5 of FIG. 1. As shown, resistive voltage dividers $R_1$, $R_1'$ through $R_{(N-1)}$, $R'_{(N-1)}$ provide bias voltages $V_1$ through $V_{(N-1)}$ at the common connections between the control transistors $Q_1$ through $Q_N$, respectively. The blocking diodes 27 and resistors 23 provide the same functions as described for the like components of FIG. 2. Capacitors $C_1$ through $C_{(N-1)}$ represent parasitic capacitance as previously described for the circuit of FIG. 2. Capacitor $C_{(N-1)}$ may, in some applications, be a discrete predetermined capacitance externally connected to the circuit to provide a desired switching time characteristic for the circuit of FIG. 3. Load 3 is connected between output terminals 7 and 29, and the reference voltage terminal 13 is receives a reference voltage $E_2$, in this example, ground. However, if $E_2$ is not at ground potential, the maximum voltage applied across the serial string of the control transistors $Q_1$ through $Q_N$ is equal to the value $(E_1-E_2)$ when the circuit of FIG. 3 is inoperative, that is, when all of the transistors of the circuit are turned off. The voltage $E_3$ at output terminal 29 is substantially equal to $+E_1$ when the output transistor 1 and control transistors $Q_1$ through $Q_N$ are turned off, and has a level equal to the voltage drop across the collector and emitter electrodes of output transistor 1 when this transistor is turned on, assuming that terminal 13 is connected to ground. Accordingly, assuming that $E_2$ is at ground potential, the minimum voltage rating for control transistor $Q_1$ is $(E_1-V_1)$, for transistor $Q_2$ is $(V_1-V_2)$, and proceeding down the chain for transistor $Q_N$ is $V_{(N-1)}$. In most applications, it is economically expedient for transistors $Q_1$ through $Q_N$ to have equal voltage ratings, whereby the voltage rating is as shown in Equation 1 below:

$$\text{Voltage Rating} = (E_1/N)) \text{ volts for each } Q_N \quad (1)$$

Again assuming equal voltage ratings for transistors $Q_1$ through $Q_N$, the bias voltages $V_1$ through $V_{(N-1)}$ are determined from Equation 2, as follows:

$$V_K = E_1 \, 1-(K/N) \text{ volts,} \tag{2}$$

where N is at least 2, and K represents the position of the bias voltage point in the serial chain, e.g., K=1 for $V_1$; K=2 for $V_2$; -K=(N-1) for $V_{(N-1)}$.

In operation of the circuit of FIG. 3, when a control signal is applied to input terminal 9, transistor $Q_N$ turns on, permitting base current to flow in transistor 1, causing the latter to turn on so there is an impedance drop between its collector and emitter electrodes, causing the voltage $+E_3$ at terminal 29 to rapidly decrease, thereby preventing excessive inverse voltage from being applied across transistors $Q_1$ through $Q_{(N-1)}$ after the turn-on of $Q_N$. Also, there is a substantial reduction in the voltage $V_{(N-1)}$ upon turn-on of transistor $Q_N$, permitting transistor $Q_{(N-1)}$ to turn on when the voltage at its gate exceeds $V_{(N-1)}$ by a predetermined value typically +8 volts. Proceeding up the chain of transistors to $Q_1$, these transistors turn on sequentially in a similar manner, for completing the turn-on of the switching circuit.

Figure 4:
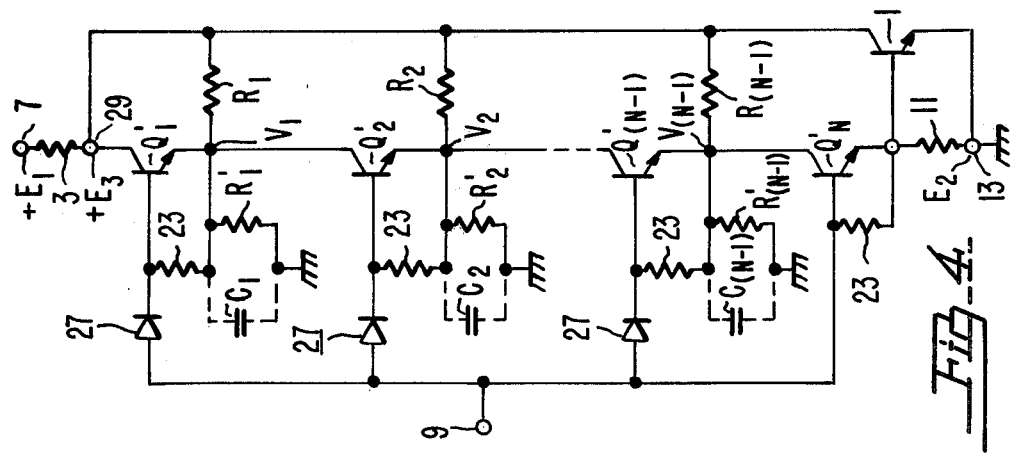

Another embodiment of the invention (FIG. 4) includes NPN bipolar transistors $Q_1'$ through $Q_N'$ which functions and are connected similarly to the MOSFET transistors $Q_1$ through $Q_N$ of FIG. 3. has a Resistor 23 is connected between the base and emitter electrodes of the $Q'_N$ bipolar transistor of FIG. 4, for ensuring fast turn-off of this transistor. The circuit of FIG. 4 operates substantially in the same manner as the circuit of FIG. 3, except that the circuit of FIG. 4 has a much lower power gain and input impedance than the circuit of FIG. 3.

Figure 5:
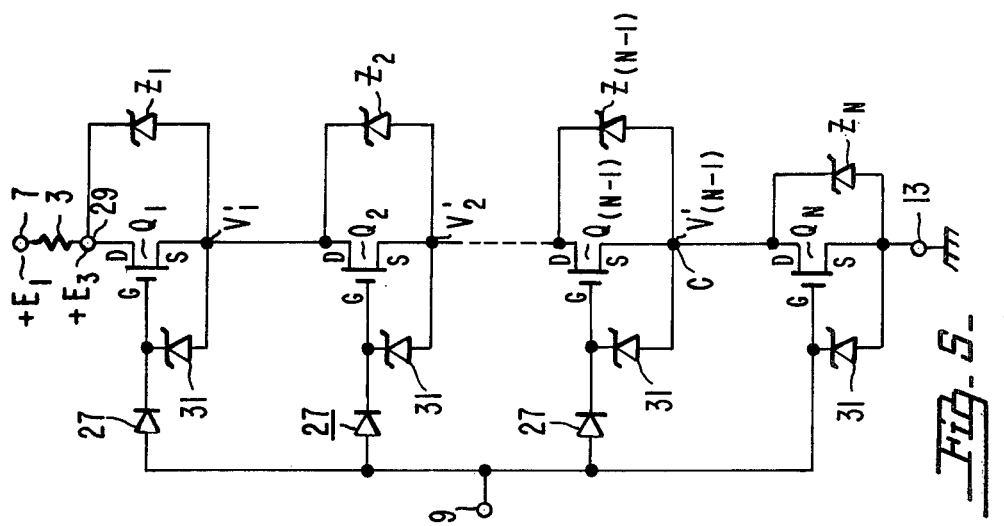

The present inventor has recognized that in certain applications it is desirable to eliminate the NPN bipolar output transistor 1 of FIG. 3, in a manner permitting field only effect transistors $Q_1$ through $Q_N$ to switch power to and from the load 3. As shown in FIG. 5, the resistive voltage divider networks of FIG. 3 are replaced by Zener diode unidirectional controlled voltage breakdown devices $Z_1$ through $Z_N$. Zener diodes $Z_1$ through $Z_N$ form a voltage divider network between output terminal 29 and reference voltage terminal 13 for providing the bias voltages $V_1'$ through $V'_{N-1}$, when the switching transistors $Q_1$ through $Q_N$ are turned off or non-conductive. Also, the breakdown voltage ratings of the Zener diodes are chosen to be no greater than the inverse voltage rating of the main current path of the particular switching transistor they are connected across. Zener diodes 31 are polarized so the anodes and cathodes thereof are respectively connected to the drains and gates of transistors $Q_1-Q_N$ to conduct current in the same direction as the main current paths of the transistors they are connected across whenever the diode breakdown voltage is exceeded. Also, an individual Zener diode 31 is connected between the gate and source electrodes of each one of the transistors $Q_1$ through $Q_N$, for protecting these field effect transistors from excessively high levels of input voltage or gate voltage.

In operation of the circuit of FIG. 5, a control signal is applied to input terminal 9, first causing transistor $Q_N$ to turn on, substantially reducing the level of voltage at point C, causing the voltage differential between the gate and source electrodes of field effect transistor $Q_{(N-1)}$ to increase and turn on this transistor. As turn on proceeds in this manner up the chain of serially connected field effect transistors to transistor $Q_1$, the voltage differentials between the gate and source electrodes similarly increases, until all of these transistors are turned on to permit current to flow through the load 3. This progression occurs very rapidly because of the relatively high switching speeds of the field effect transistors $Q_1$ through $Q_N$. If at any time during this turn-on cycle the inverse voltage rating of any particular one of these field effect transistors is exceeded, the associated Zener diode $Z_1$ through $Z_{(N-1)}$ breaks down to limit the voltage across the main current path of the particular field effect transistor to a safe value until such time that the overvoltage condition is removed. In this manner, the Zener diodes $Z_1$ through $Z_N$, provide via the reverse bias impedance and voltage breakdown level characteristics thereof, both voltage limiting of the level of voltage across the main current paths of the field effect transistors $Q_1$ through $Q_N$, and appropriate levels of bias voltages $V'_1$ and through $V'_{(N-1)}$ for ensuring that the inverse voltage ratings of the field effect transistors are not exceeded when these transistors are all turned off.

The characteristics of the modified circuit of FIG. 5 are improved by employing the circuit of FIG. 6, to include the NPN bipolar transistor 1, having its base emitter path shunted by resistor 11, which is connected in series with the circuitry between terminals 7 and 13, FIG. 5, in turn connected in shunt with the base and collector of transistor 1. More particularly, the alternative embodiment of the invention of FIG. 6 provides greater power gain and a reduced level of on-resistance in comparison to the circuit of FIG. 5, for reasons previously explained for other embodiments of the invention.

Figure 7:
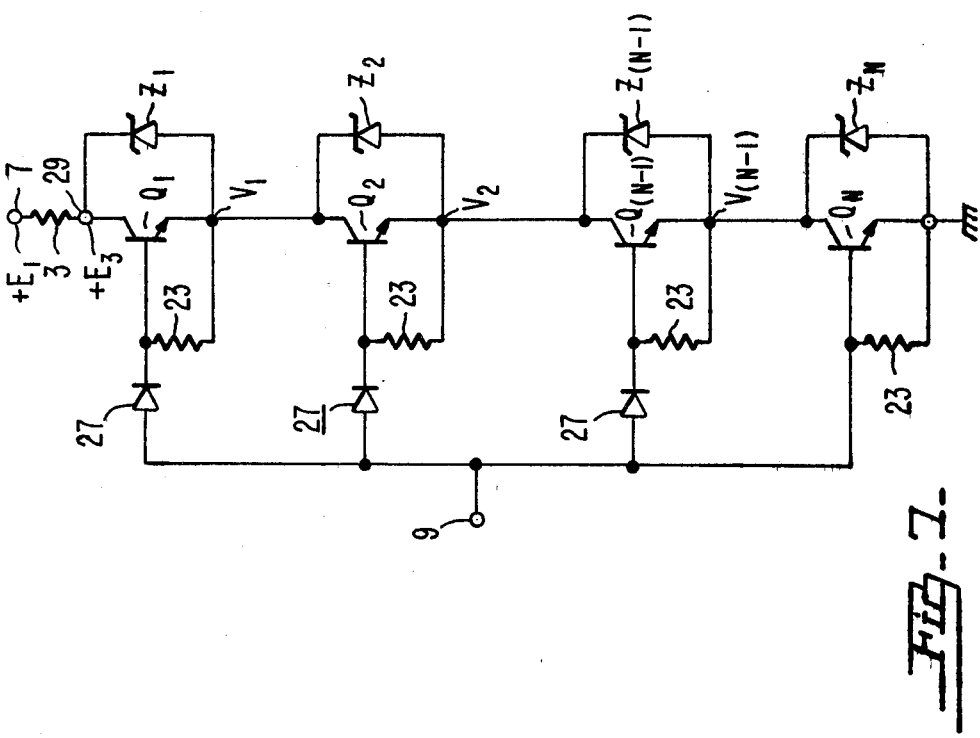

FIG. 7 is an alternative embodiment of the invention in comparison to the circuit of FIG. 5. In FIG. 7, bipolar transistors $Q_1$ through $Q_N$ are used instead of field effect transistors, respectively, as in FIG. 5. In FIG. 7, input resistors 23 are connected across the base and emitter electrodes of each one of the bipolar transistors. The circuit of FIG. 7 in comparison to the circuit of FIG. 5 has a substantially reduced input impedance, but offers the advantage of a substantially lower on-resistance because of the use of bipolar transistors, and higher power handling capability in view of present technology.

Figure 8:
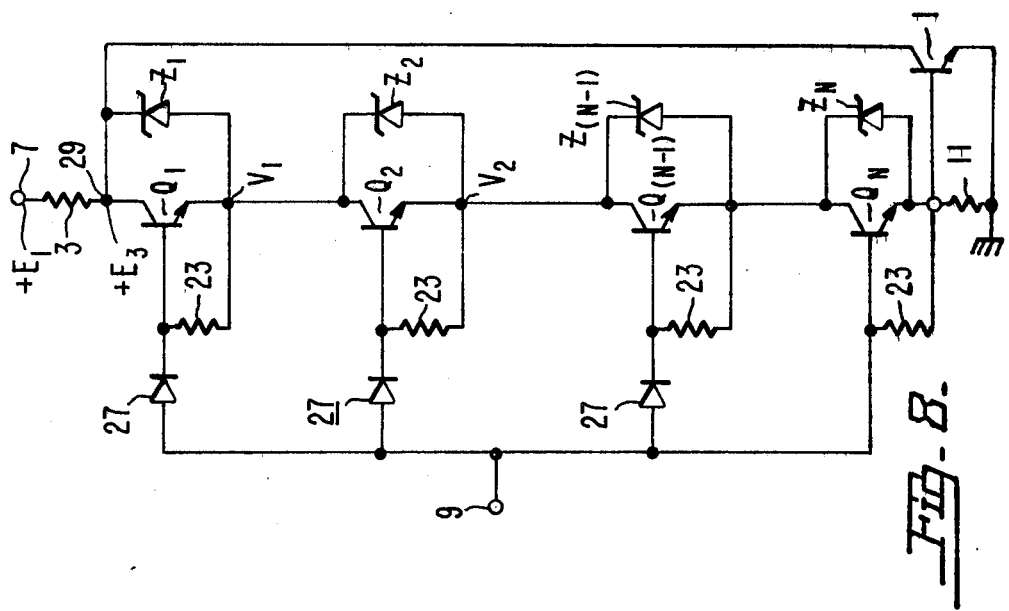

The another embodiment of the invention illustrated in FIG. 8 is a bipolar dual to the FET circuit illustrated in FIG. 6, wherein the circuit of FIG. 7 replaces the circuit of FIG. 5. In comparison to the circuit of FIG. 7, the circuit of FIG. 8 offers increased input impedance and power gain via the addition of bipolar transistor 1.

What is claimed is:

1. In a switching circuit including first and second output terminals for connecting a load therebetween, said first terminal also receiving an operating voltage of $E_1$ volts, a bipolar output transistor having a base electrode, and a main current path connected between said second output terminal and a reference voltage terminal receiving a source of reference voltage, a plurality of first through N control transistors (N=2, 3, 4 ...), each having a main current path and a control electrode, each having substantially shorter turn-on and turn-off times than said output transistor, their main current paths connected in series between said second output terminal and the base electrode of said output transistor, the first control transistor having one end of its main current path connected to said second terminal, a method for biasing and operating said N control transistors for turning on and off said output transistor, and for permitting the inverse voltage rating of the main current paths of said N control transistors when turned off to be each be substantially less than $E_1$ volts, comprising the steps of:

dividing down the voltage $V_1$ at said second terminal into a plurality of bias voltages $V_{(N-1)}$;

applying said bias voltages $V_{(N-1)}$ to the common connections between the main current paths of said first through N control transistors, respectively, said bias voltages having predetermined levels, respectively, for ensuring that the inverse voltage rating of said first through N control transistors are not exceeded, when these transistors and said bipolar transistor are non-conductive;

and applying a control signal individually to the control electrodes of said first through N control transistors, for initially turning on said $N^{th}$ one of these transistors, causing a substantial reduction in the impedance of the main current path of this transistor, thereby permitting base current to flow in said output transistor, which turns on, causing a substantial reduction in the level of impedance of its main current path, in turn causing a substantial reduction in the level of voltage at said second output terminal, and a corresponding reduction in the level of said plurality of bias voltages to levels permitting said first through $(N-1)^{th}$ control transistors to turn on, when the difference in between said control and bias voltages increases to predetermined differences, thereby completing the turn-on cycle for said output transistor.

2. The method of claim 1 further including for turning off said switching circuit, the step of removing said control signal from said input terminal, causing sequentially said $N^{th}$ control transistor to turn-off, removing base current from said output transistor substantially concurrent with said first through $(N-1)^{th}$ control transistors turning off, followed by said bipolar transistor turning off.

3. A switching circuit, comprising:

first and second output terminals for connecting a load therebetween, said first terminal also receiving an operating voltage of $E_1$ volts;

an input terminal for receiving a control signal;

a reference voltage terminal for receiving a reference potential of $E_2$ volts;

an output transistor having a main current path connected between said second output and reference voltage terminals, and a control electrode, said output transistor being responsive to said control signal for substantially reducing the impedance of its main current path;

first through N control transistors, where N is an integer number greater than 1 ($N=2, 3, 4 \ldots N^{th}$), each one of said first through N control transistors having a main current path and a control electrode, one end of the main current path of said first control transistor being connected to said second terminal, the main current paths of said first through N control transistors being connected in series between said second terminal and the control electrode of said output transistor, said first control transistor having one end of its main current path connected to said second output terminal, said control transistors having substantially faster switching speeds than said output transistor;

voltage divider means connected between said second output terminal and said reference voltage terminals, said voltage divider means having a plurality of bias voltage terminals individual connected to the successive common connections between said first through N control transistors, respectively, for applying thereto predetermined bias voltages having levels less than $(E_1-E_2)$, thereby permitting said first through N control transistors to have inverse voltage ratings substantially less than $(E_1-E_2)$, the sum of the voltage drops across the main current paths of these transistors when turned off being substantially equal to $(E_1-E_2)$;

and means connected between said input terminal and said control electrodes of said first through N control transistors, for individually applying said control signal to these control electrodes, said switching circuit being responsive to the application of said control signal to said input terminal, for sequentially first turning on the $N^{th}$ control transistor, for lowering the impedance of its main current path, thereby allowing current to flow into the control electrode of said output transistor, the latter responding by turning on to substantially lower the impedance of its main current path, causing the voltage at said second output terminal to approach the level of said reference voltage, causing the other ones of said N control transistors to turn on, substantially lowering the impedance of their respective main current paths, for completing the turn-on cycle for said output transistor, said N control transistors when turned on providing a negative feedback for current between the main current path and control electrode of said output transistor, thereby improving the transient power capability of said output transistor, and preventing saturation thereof.

4. The switching circuit of claim 3, wherein said voltage divider means includes a plurality of unidirectional controlled voltage breakdown means connected across the main current paths of each one of said first through N control transistors, respectively, the breakdown voltage of each one of said plurality of voltage breakdown means being no greater than the inverse voltage rating of the control transistor across which they are connected, respectively, said plurality of voltage breakdown means being polarized for reverse breakdown current flow in the same direction as the flow of current through the main current paths of said control transistors when turned on, for protecting said control transistors from excessive inverse voltage.

5. The switching circuit of claim 4, wherein said plurality of unidirectional controlled voltage breakdown means each consist of a zener diode.

6. The switching circuit of claim 3, wherein said voltage diode means consists of a plurality of $(N-1)$ voltage divider means each including first and second resistors connected in series between said second output terminal and said reference voltage terminal, said first resistor having one end connected to said second output terminal, the common connection between said resistors being said bias voltage terminal, the values of said first and second resistors being chosen for producing a predetermined bias voltage, at their common connection, and for having substantially greater impedance than that of said load.

7. The switching circuit of claims 3, 4, 5 or 6, wherein said means for individually applying said control signal to the control electrodes of said first through N control transistors includes:
a plurality of (N−1) unidirectional current means connected between said input terminal and corresponding ones of said control electrodes of said first through N control transistors, said (N−1) unidirectional current means being polarized for preventing current flow from said (N−1) voltage divider means to said input terminal, respectively, said input terminal being directly connected to the control electrode of said Nth control transistor.

8. The switching circuit of claim 7, wherein said plurality of (N−1) unidirectional current means each consist of a diode.

9. The switching circuit of claim 8, further including a plurality of (N−1) input resistors connected individually between the control electrodes and the common connections of the main current paths of said first through N control transistors, respectively.

10. The switching circuit of claim 7, wherein said output transistor consists of a bipolar transistor have a base electrode for said control electrode.

11. The switching circuit of claim 10, further including charge storage means connected between the bias voltage terminal of said (N−1)$_{th}$ voltage divider means and said reference voltage terminal, for delaying the turn on of said first through (N−1)$_{th}$ control transistors for a predetermined time from the turnon of said N$_{th}$ control transistor, whereby when said (N−1)$_{th}$ control transistor turns on, the impedance of its main current conduction path is substantially reduced, thereby providing a current path for discharging said charge storage means into the base electrode of said bipolar transistor.

12. The switching circuit of claim 11, wherein said charge storage means consists of a capacitor.

13. The switching circuit of claim 16, further including a relatively low value resistor connected between the base electrode of said bipolar transistor and said reference terminal, for ensuring rapid turnoff of said bipolar transistor, when in turnoff bias voltage is applied to its base electrode.

14. A switching circuit responsive to a bilevel input signal and powered by a source of voltage having a predetermined level comprising;
a bipolar transistor having a base and an emitter-collector path connected to opposite terminals of the source and to be powered by the voltage source, the bipolar transistor requiring a relatively long time to switch between conducting and cut-off states;
a negative feedback circuit between the base and collector, said negative feedback circuit including plural switching transistors having series connected main current paths between the base and collector;
means for applying a control signal to control electrodes of the switching transistors so that the main current paths of the switching transistors are activated between a conducting, forward biased state and a cut-off, reverse bias state in response to first and second levels of the control signal, the switching transistors switching between the forward and reverse bias states in a time less than the relatively long time, said switching transistors being connected between the base and collector so that the bipolar transistor emitter collector path is respectively activated to conducting, non-saturated and cut-off states in response to all of the switching transistors being forward biased and fewer than all of the switching transistors being forward biased;
each of said switching transistors having an inverse breakdown voltage less than the voltage established by the voltage source across the base and collector while the bipolar transistor is reverse biased to cut-off;
means for limiting the voltage across the main conducting path of each switching transistor to a predetermined level while that switching transistor is reverse biased, the number of switching transistors, the voltage across the base and collector of the reverse biased bipolar transistor and the inverse breakdown voltage of the switching transistors being such that the limited predetermined voltage across the main conducting path of each switching transistor is less than the inverse breakdown voltage thereof.

15. The circuit of claim 14 wherein the means for applying the control voltage includes means for activating each of the switching transistors to the forward bias state at a different time.

16. The circuit of claim 15 wherein the means for activating each of the switching transistors to the forward bias state at a different time includes timing means for forward biasing the control electrode of each transistor at a different time.

17. The circuit of claim 16 wherein the timing means for each control electrode, except one, includes a separate diode.

18. The circuit of claim 17 wherein the separate diode is in series between the control electrode and a terminal connected to a source of the control signal.

19. The circuit of claim 18 wherein the timing means for each control electrode includes a circuit shunting the control electrode, the diode supplying current from the control signal source to the circuit shunting the electrode and to the control electrode to forward bias the switching transistor.

20. The circuit of claim 19 wherein the circuit shunting the control electrode includes a resistor and capacitor.

21. The circuit of claim 19 wherein the circuit shunting the control electrode includes a Zener diode.

22. The circuit of claim 14, 15, 16, 17, 18, 19, 20, or 21 wherein the voltage limiting means for each switching transistor includes a voltage divider network connected across opposite terminals of the voltage source, each of said voltage divider networks including a separate tap for supplying a predetermined voltage across the main conducting path of the switching transistor associated therewith.

23. The circuit of claim 22 wherein each switching transistor is a field effect transistor having a source drain path forming the main conducting path and a gate electrode forming the control electrode.

24. The circuit of claim 14, 15, 16, 17, 18, 19, 20, or 21 wherein the voltage limiting means for each switching transistor includes a separate normally back biased breakdown device shunting the main conducting path of the switching transistor, the breakdown device having a breakdown voltage less than the inverse breakdown voltage of the switching transistor it shunts, the voltage across the breakdown device being maintained at a predetermined level higher than the voltage across the switching transistor main conducting path while the switching transistor is forward biased.

25. The circuit of claim 24 wherein the breakdown device is a Zener diode.

26. The circuit of claim 24 wherein each switching transistor is a field effect transistor having a source drain path forming the main conducting path and a gate electrode forming the control electrode, and the breakdown device is a Zener diode.

27. The circuit of claim 14, 15, 16, 17, 18, 19, 20 or 21 further including a bias resistor connected between the base and emitter of the bipolar transistor responsive to current flowing to the emitter of at least one of the switching transistors, and a load connected between one terminal of the voltage source and the collector of the bipolar transistor so current from the voltage source flows through the load to the bipolar collector, the main conducting paths of the switching transistor and the bias resistor in response to the switching transistors all being forward biased.

28. A circuit for supplying current to a load connected in series between terminals of a voltage source having a predetermined value and the circuit, the circuit comprising plural switching transistors having series conducting paths between terminals of the voltage source for selectively applying current from the voltage source to the load, means for applying a control signal to control electrodes of the switching transistors so that the main current paths of the switching transistors are activated between a conducting, forward biased state and a cut-off, reverse bias state in response to first and second levels of the control signal, said switching transistors being connected to the voltage source and load so that the load is supplied by the voltage source with first and second current levels in response to all of the switching transistors being forward biased and fewer than all of the switching transistors being forward biased, and the inverse breakdown voltage of the switching transistors being such that the limited predetermined voltage across the main conducting path of each switching transistor is less than the inverse breakdown voltage thereof.

29. The circuit of claim 28 wherein the means for applying the control voltage includes means for activating each of the switching transistors to be forward bias state at a different time.

30. The circuit of claim 29 wherein the means for activating each of the switching transistors to the forward bias state at a different time includes timing means for forward biasing the control electrode of each transistor at a different time.

31. The circuit of claim 30 wherein the timing means for each control electrode, except one, includes a separate diode.

32. The circuit of claim 31 wherein the separate diode is in series between the control electrode and a terminal connected to a source of the control signal.

33. The circuit of claim 32 wherein the timing means for each control electrode includes a circuit shunting the control electrode, the diode supplying current from the control signal source to the circuit shunting the electrode and to the control electrode to forward bias the switching transistor.

34. The circuit of claim 33 wherein the circuit shunting the control electrode includes a resistor and capacitor.

35. The circuit of claim 33 wherein the circuit shunting the control electrode includes a Zener diode.

36. The circuit of claim 28, 29, 30, 31, 32, 33, 34 or 35 wherein the voltage limiting means for each switching transistor includes a voltage divider network connected across opposite terminals of the voltage source, each of said voltage divider networks including a separate tap for supplying a predetermined voltage across the main conducting path of the switching transistor associated therewith.

37. The circuit of claim 28, 29, 30, 31, 32, 33, 34 or 35 wherein the voltage limiting means for each switching transistor includes a separate normally back biased breakdown device shunting the main conducting path of the switching transistor, the breakdown device having a breakdown voltage less than the inverse breakdown voltage of the switching transistor it shunts, the voltage across the breakdown device being maintained at a predetermined level higher than the voltage across the switching transistor main conducting path while the switching transistor is forward biased.

* * * * *